(12) United States Patent
Wang et al.

(10) Patent No.: US 10,193,496 B2
(45) Date of Patent: Jan. 29, 2019

(54) PHOTOVOLTAIC COMBINER BOX MONITORING SYSTEM

(71) Applicants: BOE TECHNOLOGY GROUP CO., LTD., Beijing (CN); BEIJING BOE ENERGY TECHNOLOGY CO., LTD., Beijing (CN)

(72) Inventors: Qingmeng Wang, Beijing (CN); Xiaoyan Han, Beijing (CN)

(73) Assignees: BOE TECHNOLOGY GROUP CO., LTD., Beijing (CN); BEIJING BOE ENERGY TECHNOLOGY CO., LTD., Beijing (CN)

( * ) Notice: Subject to any disclaimer, the term of this patent is extended or adjusted under 35 U.S.C. 154(b) by 174 days.

(21) Appl. No.: 15/033,451

(22) PCT Filed: Aug. 31, 2015

(86) PCT No.: PCT/CN2015/088649
§ 371 (c)(1),
(2) Date: Apr. 29, 2016

(87) PCT Pub. No.: WO2016/173161
PCT Pub. Date: Nov. 3, 2016

(65) Prior Publication Data
US 2017/0117847 A1 Apr. 27, 2017

(30) Foreign Application Priority Data
Apr. 29, 2015 (CN) .................... 2015 2 0272043 U

(51) Int. Cl.
*H02S 50/10* (2014.01)
*G01R 1/36* (2006.01)
*H02S 50/00* (2014.01)

(52) U.S. Cl.
CPC ............... *H02S 50/10* (2014.12); *G01R 1/36* (2013.01); *H02S 50/00* (2013.01)

(58) Field of Classification Search
CPC ........... H02S 50/10; G01R 1/36; G01R 19/00; G06F 17/18; H04B 10/00; H04B 11/00; H02B 1/24; G08C 23/02
See application file for complete search history.

(56) References Cited

U.S. PATENT DOCUMENTS

2011/0267324 A1* 11/2011 Stephens .............. G09G 3/3611
345/207
2011/0295535 A1* 12/2011 Lewis ..................... H02S 50/10
702/64

(Continued)

FOREIGN PATENT DOCUMENTS

CN 202002985 U 10/2011
CN 202362653 U 8/2012

(Continued)

OTHER PUBLICATIONS

First Chinese Office Action dated Jun. 23, 2015; Appln. No. 201520272043.5.

(Continued)

*Primary Examiner* — Huy Q Phan
*Assistant Examiner* — Zannatul Ferdous
(74) *Attorney, Agent, or Firm* — Ladas & Parry LLP; Loren K. Thompson

(57) ABSTRACT

A photovoltaic combiner box monitoring system includes a current sampling circuit, a microprocessor and a communication circuit; the current sampling circuit is connected with the microprocessor to sample at least one channel of current signals and input the sampled currents to the microprocessor; and the microprocessor is connected with the communication circuit to send the current signals sampled by the current sampling circuit by the communication circuit. Thus, (Continued)

the photovoltaic combiner box monitoring system can sample current signals from the photovoltaic combiner box by means of the current sampling circuit and send the sampled current signals through the communication circuit.

14 Claims, 6 Drawing Sheets

(56) References Cited

U.S. PATENT DOCUMENTS

| 2012/0049879 | A1* | 3/2012 | Crites | H02S 50/10 |
| | | | | 324/761.01 |
| 2012/0098459 | A1* | 4/2012 | Lee | H05B 33/0827 |
| | | | | 315/294 |

FOREIGN PATENT DOCUMENTS

| CN | 202404399 U | 8/2012 |
| CN | 203135757 U | 8/2013 |

OTHER PUBLICATIONS

International Search Report and Written Opinion both dated Jan. 26, 2016; PCT/CN2015088649.

* cited by examiner

PHOTOVOLTAIC COMBINER BOX MONITORING SYSTEM

TECHNICAL FIELD

At least one embodiment of the present invention relates to a photovoltaic combiner box monitoring system.

BACKGROUND

During photovoltaic power generation, a plurality of photovoltaic cell components operate together to generate power. However, each of the photovoltaic cell components generates a low current, and thus currents generated from the respective photovoltaic cells are combined by means of a photovoltaic combiner box and then are supplied to users to meet electricity demand of the users.

SUMMARY

The disclosure provides a photovoltaic combiner box monitoring system which may monitor the photovoltaic combiner box in real time.

In a first aspect, an embodiment of the disclosure provides a photovoltaic combiner box monitoring system, comprising a current sampling circuit, a microprocessor and a communication circuit; the current sampling circuit is connected with the microprocessor, and configured to sample at least one channel of current signals and input the sampled currents to the microprocessor; and the microprocessor is connected with the communication circuit, configured to send the current signals sampled by the current sampling circuit by the communication circuit.

For example, the current sampling circuit can comprise at least one sampling branch, and each sampling branch at least one sampling branch, and each sampling branch comprises a connector and a line selector; the connector is connected with the line selector, and configured to sample a plurality of channels of current signals and input each channel of current signals to one of current input ports of the line selector by means of a port of the connector; and the line selector is connected with the microprocessor, and configured to output current signals that are inputted to respective current input ports of the line selector to the microprocessor in time division manner according to control signals output from the microprocessor.

For example, each sampling branch further comprises an emitter follower, the emitter follower is connected between an output terminal of the line selector and the microprocessor, and configured to amplify the current signals that are output from the line selector and output the amplified current signals to the microprocessor.

For example, each sampling branch further comprises a filter circuit, the filter circuit is connected between the emitter follower and the microprocessor, and configured to filter signals that are output from the emitter follower and output the filtered signal to the microprocessor.

For example, each sampling branch further comprises a clamp protection circuit, the clamp protection circuit is connected with the output terminal of the corresponding sampling branch to which the clamp protection circuit belongs, and configured to prevent a voltage of the output terminal of the corresponding sampling branch from exceeding a predetermined value.

For example, the clamp protection circuit is a BAS70-04 chip.

For example, a plurality of sampling branches are provided, the microprocessor comprises respective sampling current input terminals that are connected with respective output terminals of different sampling branches, and respective controls of line selectors of different sampling branches are connected with same control signal output terminals of the microprocessor.

For example, the connector can be a header 10×2 chip.

For example, the line selector can be a U5CD4051B chip.

For example, the photovoltaic combiner box monitoring system can further comprise a voltage sampling circuit; the voltage sampling circuit is connected with the microprocessor, and configured to sample voltage signals from the photovoltaic combiner box and output the sampled voltage signals to the microprocessor, the microprocessor is further configured to send the voltage signals sampled by the voltage sampling circuit through the communication circuit.

For example, the photovoltaic combiner box monitoring system can further comprise a lightning protection monitor circuit; the lightning protection monitor is connected with the microprocessor, and configured to sample lightning protection signals and input the sampled lightning protection signal to the microprocessor; and the microprocessor is further configured to send the lightning protection signals sampled by the lightning protection monitor circuit through the communication circuit.

For example, the photovoltaic combiner box monitoring system can further comprise a digital display circuit; the digital display circuit is connected with the microprocessor, and configured to display the sampled signals received by the microprocessor.

For example, the digital display circuit can comprise a first ULN2803A chip and a second ULN2803A chip and a XSM-S2351A chip; an input terminal of the first ULN2803A chip is connected with the microprocessor, and an output terminal of the first ULN2803A chip is connected with the XSM-S2351A chip, and configured to invert the sampled signals output from the microprocessor and output the inverted sampled signals to a data signal input of the XSM-S2351A chip; an input of the second ULN2803A chip is connected with the microprocessor, and an output of the second ULN2803A chip is connected with the XSM-S2351A chip, and configured to invert the control signals output from the microprocessor and output the inverted control signals to a control signal input of the XSM-S2351A chip.

For example, the photovoltaic combiner box monitoring system can further comprise an auxiliary power supply; the auxiliary power supply is connected with the microprocessor, and configured to supply an operation voltage to the microprocessor.

For example, the communication circuit can comprise an ADM2483 chip and a lightning protection circuit which is connected with the ADM2483 chip.

For example, the microprocessor can be a STM32F030R8T6 chip.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Usually, a photovoltaic power generation system needs to be maintained once after a time period, generally once every six months. In a period between two operations of maintenance, when one or more photovoltaic arrays suffer from malfunction, a user cannot find this malfunction in a photovoltaic array in time, resulting in a great deal of loss in power. Furthermore, this kind of maintenance operation is complicated in general.

Figure 1:
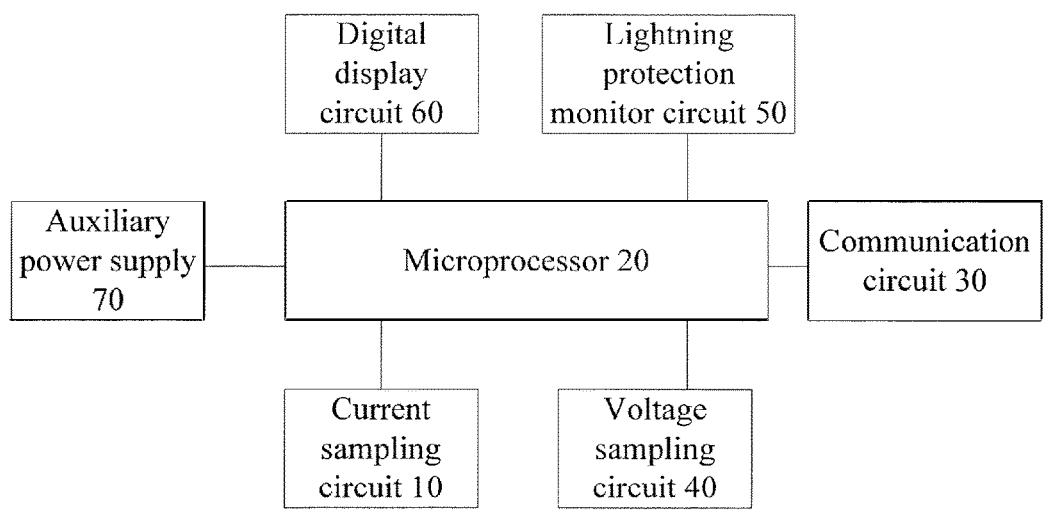
FIG. 1 is a structural schematic diagram of an photovoltaic combiner box monitoring system according to an embodiment of the disclosure.

Therefore, an embodiment of the disclosure provides a photovoltaic combiner box monitoring system. As shown in FIG. 1, the photovoltaic combiner monitoring system comprises: a current sampling circuit 10, a microprocessor 20, and a communication circuit 30. The current sampling circuit 10 is connected with the microprocessor 20, configured to sample at least one channel of current signals and input the sampled current signals into the microprocessor 20. The microprocessor 20 is connected with the communication circuit 30, configured to send the current signals sampled by the current sampling circuit 10 via the communication circuit 30.

The photovoltaic combiner box monitoring system can sample in real time the current signals in the photovoltaic combiner box by means of the current sampling circuit and send the sampled current signals via the communication circuit.

Figure 2:
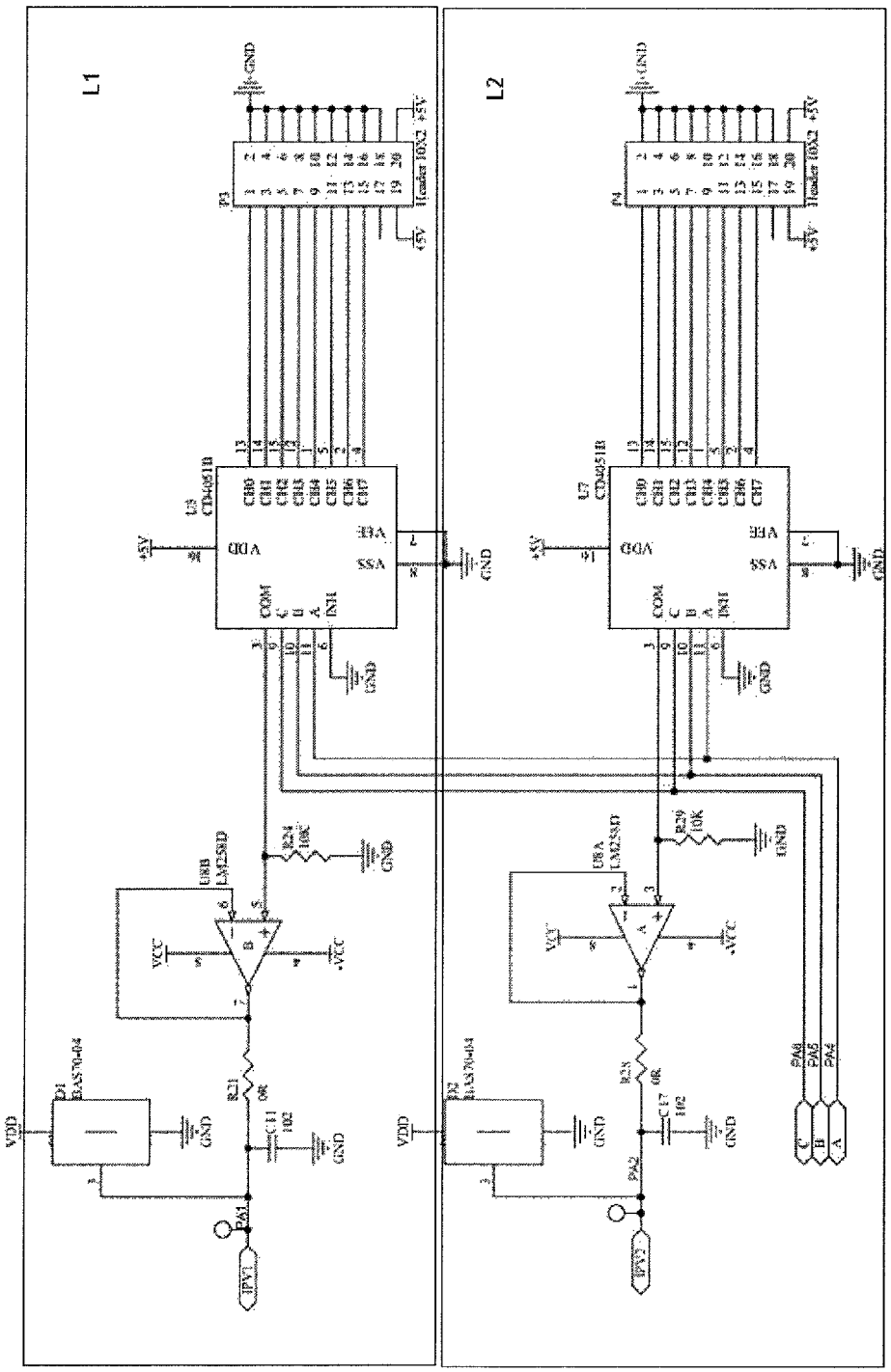
FIG. 2 is a structural schematic diagram of an example of a current sampling circuit 10 of FIG. 1.

The current sampling circuit 10 may have various specific structures. The structure of an example of the current sampling circuit 10 will be illustrated below in conjunction with FIG. 2. As shown in FIG. 2, the current sampling circuit can comprises two same sampling branches L1 and L2, each branch comprising a plug-in connector (for example, this plug-in connector can be a header 10×2 chip; the plug-in connector of the sampling branch L1 is indicated as P3 and a plug-in connector of the sampling branch L2 is indicated as P4, for the purpose of easy reorganization), a line selector (for example, this line selector can be a CD4501B chip; the line selector of the sampling branch L1 is indicated as U5, and the line selector of the sampling branch L2 is indicated as U7, for the purpose of easy reorganization), an emitter follower (for example, this emitter follower can be a LM258D chip; the emitter follower of the sampling branch L1 is indicated as U8B, and the emitter follower of the sampling branch L2 is indicated as U8A, for the purpose of easy reorganization), a filter circuit (the filter of the sampling branch L1 comprises a resistor which has a resistance 0R and is indicated as R21 and a capacitor which has a capacitance 1 pF and is indicated as C11, and the filter of the sampling branch L2 comprises a resistor which is indicated as R28 and a capacitor which is indicated as C17 and this resistor and the capacitor are the same as the counterparts in the sampling branch L1 in values) and a clamper circuit (for example, the clamper circuit can be a BAS70-04 chip; the clamper circuit of the sampling branch L1 is indicated as D1 and a clamper circuit of the sampling branch L2 is indicated as D2, for the purpose of easy reorganization). The elements of the sampling circuit L1 have same types and specifications as respective corresponding elements of the sampling circuit L2. Only the specific configuration of the sampling branch L1 will be illustrated below for easy understanding. As shown in FIG. 2, in the sampling branch L1, 8 pins, that is, pins 2, 4, 6, 8, 10, 12, 14, 16 and 18, of the connector P3 are connected to a ground GND. 8 pins, that is, pins 1, 3, 5, 7, 9, 11, 13 and 15, of the connector P3 are connected with 8 pins, that is, pins 13, 14, 15, 12, 1, 5, 4 and 2, of the line connector U5 correspondingly. In operation, pins 19 and 20 of the connector P3 are connected to a voltage of 5V.

Pins 11, 10 and 9 of the line selector U5 are connected with three current sampling control output pins (which are assumed as PA4, PA5 and PA6) of the microprocessor 20 correspondingly one by one, and pins 6, 7 and 8 of the line selector U5 are connected with the ground GND.

In operation, a voltage of 5V is input to a pin 16 of the line selector U5, and the microprocessor 20 outputs corresponding control signals through the three pins PA4, PA5 and PA6, to make a pin 3 of the line selector to connect with pins 13, 14, 15, 12, 1, 5, 4 or 2 of the line selector respectively in a time division manner, so that eight (8) channels of current signals sampled by the connector P3 are output to the emitter follower U8B via the pin 3 of the line selector U5 in a time division manner.

The emitter follower U8B amplifies the current signals output from the pin 3 of the connector 3, and outputs the amplified current signals through a pin 7 of the emitter follower U8B to the filter circuit comprising a resistor R21 having resistance 0 ohm (0R) and a capacitor C11 having capacitance 1000 nF (102).

An output terminal of the filter circuit is connected with an output terminal IPV1 of the sampling branch L1 (an output terminal of the sampling branch L2 is indicated as IPV2). The output terminal IPV1 of the sampling branch L1 is connected with a current input pin of the microprocessor 20 (it is assumed that the output terminal IPV1 of the sampling branch L1 is connected with the pin PA1 of the microprocessor 20, and the output terminal IPV2 of the sampling branch L2 is connected with the pin PA2 of the processor 20). The clamper circuit D1 of the sampling branch L1 is connected with the output terminal IPV1 of the sampling branch L1, and the clamper circuit D2 of the sampling branch L2 is connected with the output terminal IPV2 of the sampling branch L2, to prevent the voltage input to the output terminal of the filter circuit from exceeding a preset value.

A work flow of the current sampling circuit 10 will be illustrated below in conjunction with FIG. 2. In an embodiment, the connectors P3 and P4 receive the current signals output from the current sensors plugged in the connectors, and output the received signals through the eight (8) pins thereof to the eight (8) pins of the line selector U5 correspondingly one by one. The line selector U5 receives control signals from the microprocessor 20 through three (3) pins, that is, pins 11, 10 and 9 (levels of the three pins has 8 kinds of ON states in combination), and connects the pin 3 of the line selector U5 with respective input pins of the line selector U5 in a time division manner according to the eight (8) kinds of ON states corresponding to the combinations of levels of the three pins, and thus at a timing, a current signal is output to a positive polar of the emitter follower U8B from the pin 3 of the line selector, and is amplified by the emitter follower U8B to output to the filter circuit which comprises R21 and C11. The filtered current signals are input to the pin PA1 of the microprocessor 20. Now, sampling of the current signals is completed.

In addition, as shown in FIG. 2, the sampling branch L1 further comprises a resistor R24 having resistance 10K. One end of the resistor R24 is connected with the ground, and another end of the resistor R24 is connected with the positive polar (pin 5) of the emitter follower of the sampling branch L1. Similarly, the sampling branch L2 further comprises a resistor R29 having resistance 10K. One end of the resistor R29 is connected with the ground, and another end of the resistor R29 is connected with the positive polar (pin 3) of the emitter follower of the sampling branch L2. In such a way, a part of a current which should be input into the emitter follower can be shunted, so as to protect the emitter follower.

In the embodiment, the current sampling circuit as shown in FIG. 2 can sample 16 channels of current signals, and its structure is simple and compact. In addition, the current sampling circuit as shown in FIG. 2 implements corresponding controls by means of three pins (PA4, PA5 and PA6), and thus the controls are easily to implement. It should be understood that, the purpose of providing the emitter follower in FIG. 2 is to amplify the current signals output from the line selector, so as to easily obtain good signals. In the embodiment of the disclosure, the emitter follower is not a structure feature which should be provided necessarily.

Here, the filter circuit is provided to improve a signal-to-noise ratio of the current signal and the clamper circuit is provided to protect the microprocessor from being damaged by overvoltage. In the embodiments of the disclosure, the filter circuit and the clamp protection circuit are not the structure features which should be provided necessarily.

In an embodiment, as shown in FIG. 1, the photovoltaic combiner box monitoring system can further comprise a voltage sampling circuit 40. The voltage sampling circuit 40 is connected with the microprocessor 20. The microprocessor 20 is further configured to send the voltage signals sampled by the voltage sampling circuit 40 through the communication circuit 40.

In an embodiment, the voltage sampling circuit 40 can further sample the voltage signals of the photovoltaic combiner box and send the sampled voltage signals in real time.

Figure 3:
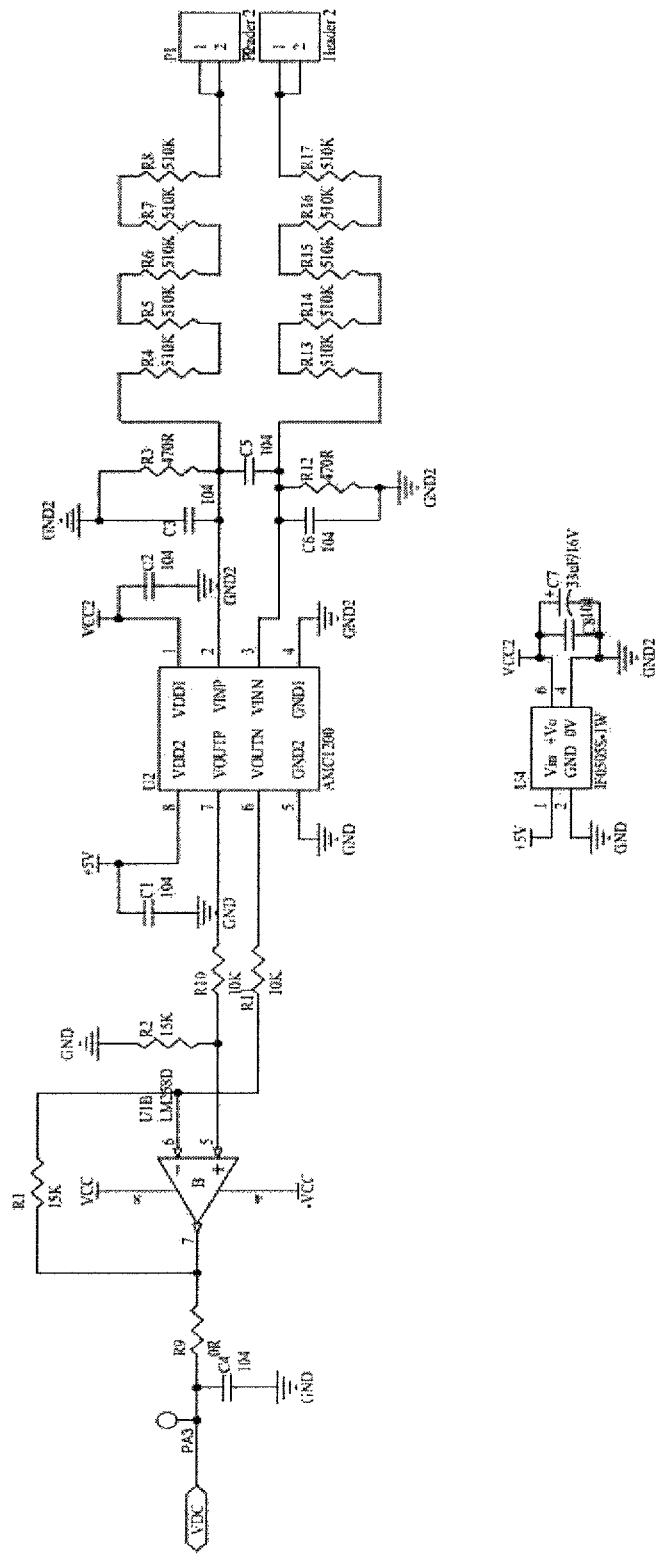
FIG. 3 is a structural schematic diagram of an example of a voltage sampling circuit 40 of FIG. 1.

In an embodiment, the voltage sampling circuit 40 can be as shown in FIG. 3, and it comprises two connectors P1 and P2 (the model of each of the connectors is Header 2, for example), two current limiter circuits (the first current limiter circuit comprises resistors R4, R5, R6, R7 and R8 which are connected in series, the second current limiter circuit comprises resistors R13, R14, R15, R16 and R17 which are connected in a series, and the resistance of each of the resistors of the current limiter circuits is 510K), three filter circuits (the first filter circuit comprises a resistor R3 having resistance 47 ohm (470R) and a capacitor C3 having capacitance 0.1 μF, the second filter circuit comprises a resistor R12 having resistance 47 ohm (470R) and a capacitor C6 having capacitance 0.1 μF (104), and the third filter circuit comprises a resistor R9 having resistance 0 ohm (0R) and a capacitor C4 having capacitance 0.1 μF (104)), an isolated operational amplifier circuit U2 (which can be a AMC1200 chip, for example) and an emitter follower (for example, the emitter follower can be an LM258D chip, and the emitter follower is indicated as U1B for easy distinguishing). The voltage sampling circuit further comprises capacitors C5, C1 and C2, each of which having capacitance 0.1 μF (104), resistors R10 and R11, each of which having resistance 10K, and a resistor R2 having resistance 15K. Two pins of the connector P1 are connected to each other, and are connected to the pin 2 of the isolated operational amplifier circuit U2 through the first current limiter circuit and the first filter circuit in sequence. Two pins of the connector P2 are connected to each other, and are connected to the pin 3 of the isolated operational amplifier circuit U2 through the second current limiter circuit and the second filter circuit in sequence. The capacitor C5 is connected between the first filter circuit and the second filter circuit.

The pin 8 of the isolated operational amplifier circuit U2 is connected with a polar of the capacitor C1. In operation, a voltage of 5V is input, the pin 1 of U2 is connected with a polar of the capacitor C2, the pins 4 and 5 are connected with ground GND, the pin 6 of U2 is connected with both a negative polar (pin 6) and an output terminal (pin 7) of U1B through the resistor R11, the pin 7 of the isolated operational amplifier circuit U2 is connected with an output terminal VDC through the third filter circuit, and the output terminal VDC is connected with the voltage sampling signal input pin of the microprocessor 20 (which is assumed as PA3).

Furthermore, as shown in FIG. 3, the voltage sampling circuit 40 further comprises a peripheral circuit which is connected with the pin 1 of U2 (connected to the pin 1 along with the terminal VCC2). For example, the peripheral circuit comprises a IF0505S-1W chip (which is indicated as U4), a capacitor C whose capacitance is 0.1 μF (104), and a capacitor C7 which has a rated value of 33 μF/16V. In this peripheral circuit, the capacitors C8 and C7 are connected in parallel between pins 4 and 6 of F0505S-1W circuit, and in operation, a voltage of 5V is input to the pin 1 of F0505S-1W circuit, and the pin 2 of F0505S-1W circuit is grounded.

In an embodiment, as shown in FIG. 1, the photovoltaic combiner box monitoring system further comprises a lightning protection monitor circuit 50. The lightning protection monitor circuit 50 is connected with the microprocessor 20, so as to sample lightning protection signals and input the sampled signals to the microprocessor 20. In this case, in an embodiment, the microprocessor is further configured to send the lightning signals sampled by the lightning protection detection circuit 50 through the communication circuit 30.

In an embodiment, the lightning protection monitor circuit 50 can sample the lightning protection signals from the photovoltaic combiner box and send these sampled signals in real time.

Figure 4:
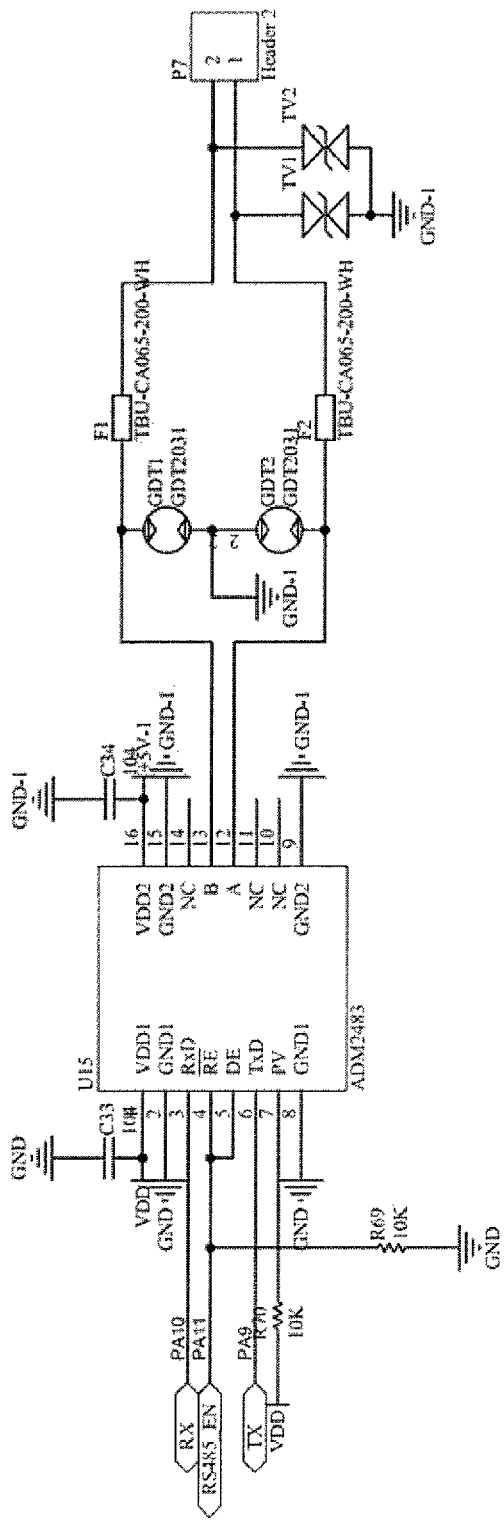
FIG. 4 is a structural schematic diagram of an example of a communication circuit 30 of FIG. 1.

In an embodiment, the above mentioned communication circuit 30 can be configured as shown in FIG. 4. The communication circuit 30 can comprise a transceiver U15 (which can be an ADM 2483 chip, for example), a lightning protection circuit connected with the ADM2483 chip and the corresponding peripheral circuits thereof (which comprise capacitors C34 and C33, each of which having capacitance 010.1 μF, a resistor R69 having resistance 10K, and a resistor R70 having resistance 10K). The lightning protection circuit comprises gas discharging tubes GDT1 and GDT2 (the model of each of them is GDT2031), field effect transistor F1 and F2 (e.g., the model of each of them is TBU-CA065-200-WH, for example), transient suppression diodes TV1 and TV2, and a connector P7 (the model of the connector is Header 2, for example). Pins 1 and 16 of the AMD2483 chip are connected with a polar of a capacitor C33 and a polar of a capacitor C34 respectively. Pins 2, 8, 9 and 15 of the AMD2483 chip are connected with the ground GND. The pin 1 of AMD2483 chip is further connected with an operation voltage VDD. The Pin 7 of the AMD2483 chip is connected with the VDD through a resistor R70 having resistance 10K. The pin 6 of the AMD2483 chip is connected with a send pin (which is assumed as pin PA9). The pin 3 of the AMD2483 chip is connected with a reception pin (which is assumed as pin PA10). Pins 4 and 5 of the AMD2483 chip are connected with a control signal output pin (which is assumed as pin PA11). Pins 12 and 13 of the AMD2483 chip are connected with the lightning protection circuit. In an embodiment, an end of each of the gas discharge tubes GDT1 and GDT2 is connected with the ground GND-1. Another end of the GDT1 is connected with the pin 12 of the AMD2483 chip, and another end of the GDT2 is connected with the pin 13 of the AMD2483 chip. The pin 2 of two pins of P 7 is connected to the pin 13 of the AMD2483 chip through the transistor F1, and the pin 1 of P7 is connected with the pin 12 of the AMD2483 chip by the transistor F2.

In an embodiment, as shown in FIG. 1, the above mentioned system can further comprise a digital display circuit 60. The digital display circuit 60 is connected with the microprocessor 20, to display sampled signals received by the microprocessor 20.

Figure 5:
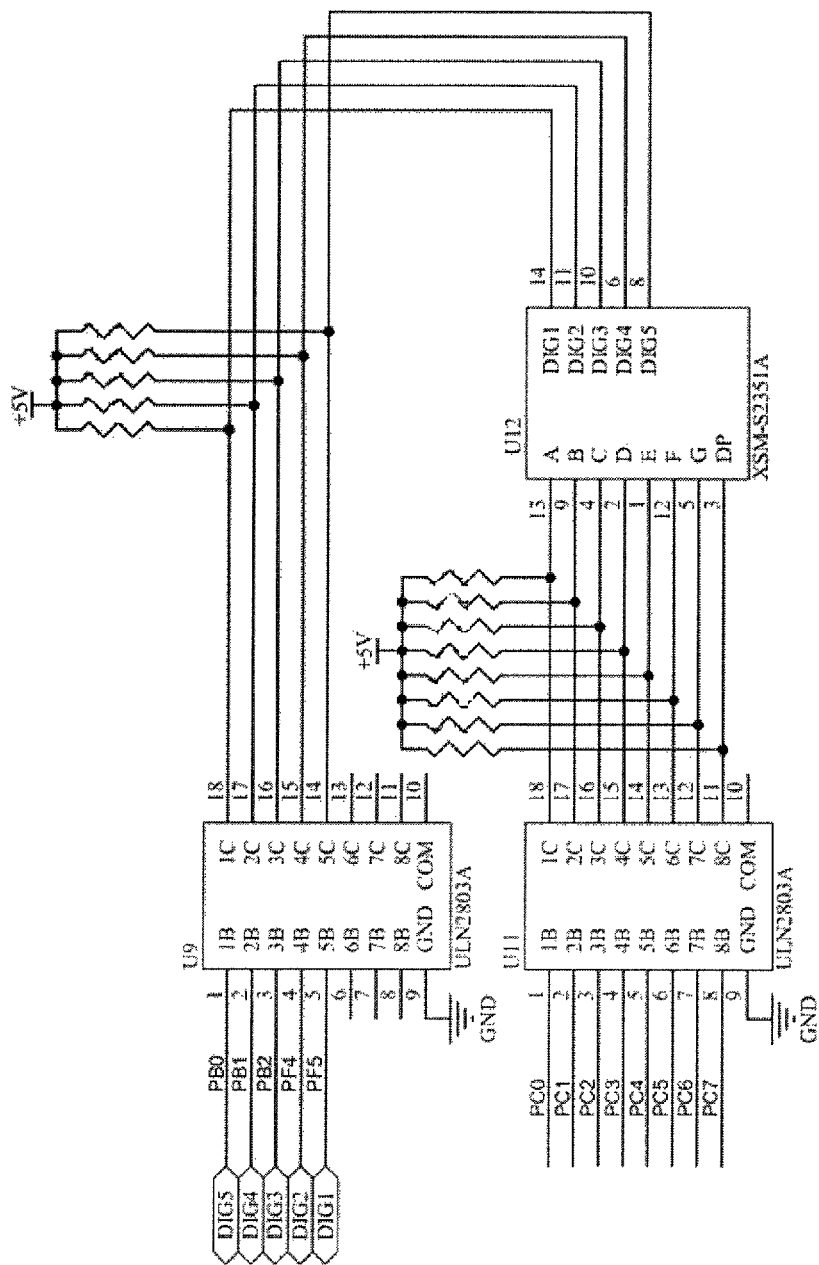
FIG. 5 is a structural schematic diagram of an example of a digital display circuit 60 of FIG. 1.

In an embodiment, as shown in FIG. 5, the digital display circuit 60 can comprise two ULN2803A chips (which are indicated as U9 and U10 in FIG. 5 respectively) and a XSM-S2351A chip (which is indicated as U 11 in FIG. 5). A plurality of input terminals (pins 1, 2, 3, 4 and 5) of the XSM-S2351A circuit U9 are connected with a plurality of data signal output pins (which are assumed as five pins DIG1, DIG2, DIG3, DIG4 and DIG5) of the microprocessor. A plurality of output terminals (pins 14, 15, 16, 17 and 18) of the XSM-S2351A circuit U9 are connected with a plurality of data signal input pins (pins 14, 11, 10, 6 and 8) of the XSM-S2351A chip respectively one by one. In addition, a plurality of input terminals (pins 1, 2, 3, 4, 5, 6, 7 and 8) of the ULN2803A circuit U11 are connected with a plurality of display control signal output pins (which are assumed as PC0, PC1, PC2, PC3, PC4, PC5, PC6 and PC7) of the microprocessor. A plurality of output terminals (pins 11, 12, 13, 14, 15, 16, 17 and 18) of the ULN2803A circuit U11 are connected with a plurality of control signal input pins (pins 13, 9, 4, 3, 1, 12, 5 and 3) of the XSM-S2351A chip respectively.

In an embodiment, as shown in FIG. 1, the photovoltaic combiner box monitoring system can further comprise an auxiliary power supply 70. The auxiliary power supply 70 is connected with the microprocessor 20, to provide an operation voltage to the microprocessor 20.

Figure 6:
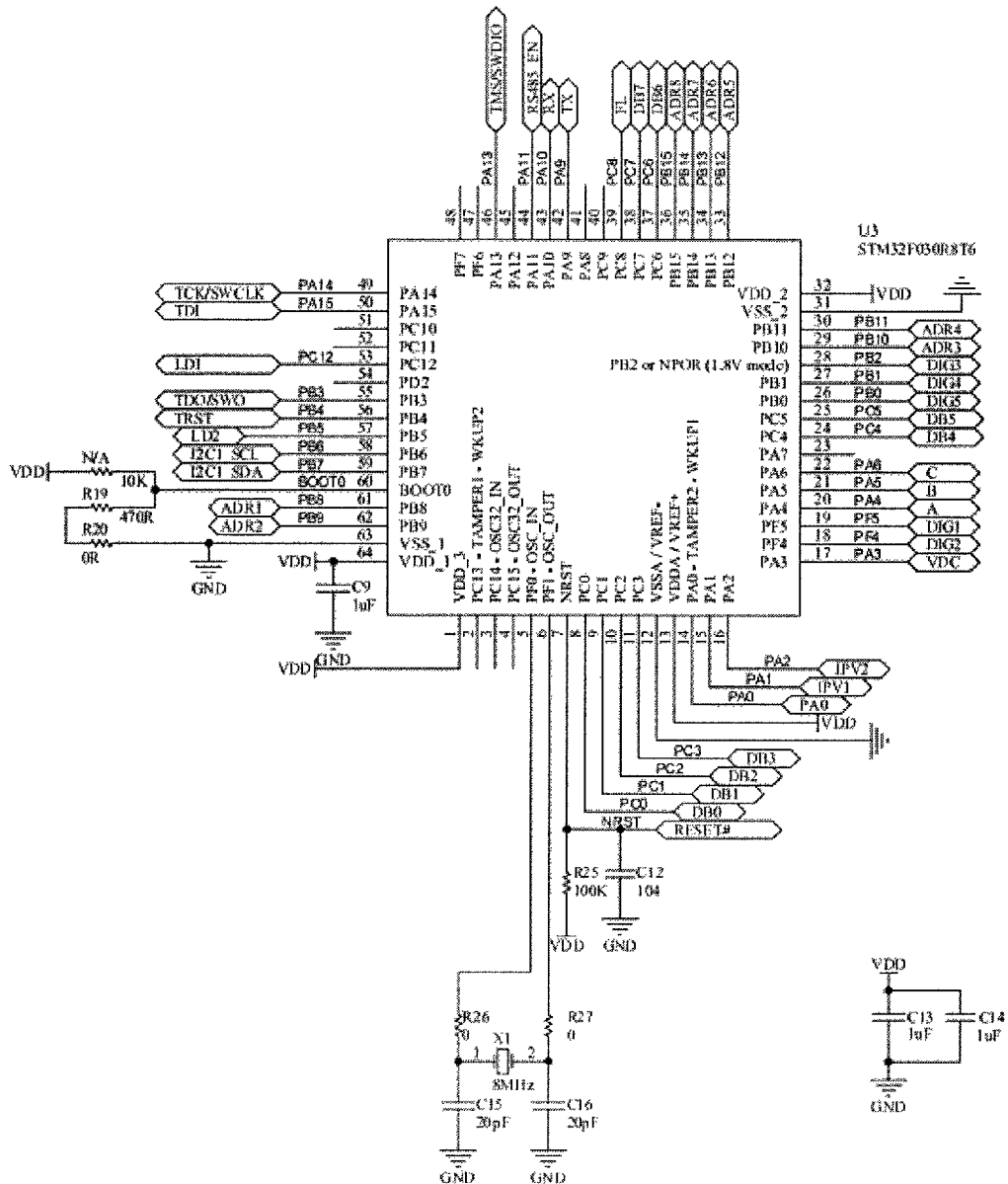
FIG. 6 is a structural schematic diagram of an example of a microprocessor 20 of FIG. 1.

In an embodiment, the microprocessor can be a STM32F030R8T6 processor. As shown in FIG. 6, the microprocessor has 64 pins. Pins 20, 21 and 22 of the microprocessor are indicated as PA4, PA5 and PA6 to connect with pins 11, 10 and 9 of the liner selectors U5 and U7 of the current sampling circuit as shown in FIG. 2 correspondingly. Pins 15 and 16 of the microprocessor are indicated as IPV2 and IPV1 to connect with two output terminals of the current sampling circuit correspondingly. Pins 18, 19, 28, 27 and 26 of the microprocessor are indicated as DIG1, DIG2, DIG3, DIG4 and DIG5 to connect with the pins 5, 4, 3, 2 and 1 of U9 of the communication circuit correspondingly. Pins 8, 9, 10, 11, 24, 25, 37 and 38 of the microprocessor are used as control signal output pins (PC0, PC1, PC2, PC3, PC4, PC5, PC6 and PC7) to connect with the pins 1, 2, 3, 4, 5, 6, 7 and 8 of U11 of the communication circuit correspondingly. Pins 42, 43 and 44 of the microprocessor are used as PA10, PA11 and PA12 to connect with the pins 6, 4, 5 and 3 of U15 of the communication circuit correspondingly.

A processor STM32F030R8T6 is employed as the microprocessor of the embodiments of the disclosure, to reduce manufacturing costs of the entire system.

In an embodiment, as shown in FIG. 6, the processor 20 can comprise a peripheral circuit connected with the processor STM32F030R8T6 in addition to the processor STM32F030R8T6. The peripheral circuit comprises: a resistor having resistance 10K and connected between the ground GND and the pin 60 of the processor STM32F030R8T6; a resistor R 19 having resistance 470R and a resistor R 20 having resistance 0R, the resistor R19 and the resistor R20 being connected in series and being connected between the pins 60 and 63 of the processor; a capacitor C9 having capacitance 11 μF and connected between the pin 64 of the processor and the ground GND; a resistor R25 having resistance 100K and connected between a node reset REST of the processor and an operation voltage VDD; a capacitor C12 having capacitance 0.1 uF and connected between the reset REST of the processor and the ground GND; a resistor R26 having resistance 0R and connected between a first node 1 and the pin 5 of the processor; a resistor R27 having resistance 0R and connected between a second node 1 and the pin 5 of the processor; a crystal oscillator tube X1 having an oscillation frequency 8 MHz and connected between the first node 1 and the second node 2; a capacitor C15 having capacitance 20 pF and connected between the first node 1 and the ground GND; a capacitor C16 having capacitance 20 pF and connected between the second node 2 and the ground GND; and capacitors C13 and C14, both of which have capacitance 1 μF and are connected between the operation voltage input VDD and the ground GND in parallel.

It should be understood that, specific models and parameters of respective elements mentioned above will not limit the embodiments of the disclosure.

Therefore, the embodiments of the invention can sample current signals from the photovoltaic combiner box by means of the current sampling circuit and send the sampled current signals through the communication circuit.

The above mentioned embodiments can be combined in any way, and redundant portions will be omitted here.

Those skilled in the art should understand that, the above mentioned embodiments are only exemplary, and not limitative to the scope of the disclosure. The scopes of the disclosure are defined by the accompanying claims.

This application claims the priority of Chinese Patent Application No. 201520272043.5 filed on Apr. 29, 2015, which is hereby incorporated entirely herein by reference.

The invention claimed is:

1. A photovoltaic combiner box monitoring system, comprising a current sampling circuit, a microprocessor and a communication circuit, wherein the current sampling circuit is connected with the microprocessor, and configured to sample at least one channel of current signals and input the sampled currents to the microprocessor, the current sampling circuit comprises at least one sampling branch, and each sampling branch comprises a connector and a line selector; the connector is connected with the line selector, and configured to sample a plurality of channels of current signals and input each channel of current signals to one of current input ports of the line selector by means of a port of the connector; and the line selector is connected with the microprocessor, and configured to output current signals that are inputted to respective current input ports of the line selector to the microprocessor in time division manner according to control signals output from the microprocessor; and the microprocessor is connected with the communication circuit, and configured to send the current signals sampled by the current sampling circuit via the communication circuit.

2. The system of claim 1, wherein each sampling branch further comprises an emitter follower, the emitter follower is connected between an output terminal of the line selector and the microprocessor, and configured to amplify the current signals from the line selector and to output the amplified current signals to the microprocessor.

3. The system of claim 2, wherein each sampling branch further comprises a filter circuit, the filter circuit is connected between the emitter follower and the microprocessor, and configured to filter signals that are outputted from the emitter follower and output the filtered signals to the microprocessor.

4. The system of claim 1, wherein each sampling branch further comprises a clamp protection circuit, the clamp protection circuit is connected with an output terminal of the corresponding sampling branch to which the clamp protection circuit belongs, and is configured to prevent a voltage of the output terminal of the corresponding sampling branch from exceeding a predetermined value.

5. The system of claim 1, wherein a plurality of sampling branches are provided, the microprocessor comprises respective sampling current input terminals that are connected with respective output terminals of different sampling branches, and respective controls of line selectors of different sampling branches are connected with same control signal output terminals of the microprocessor.

6. The system of claim 1, further comprising a voltage sampling circuit, wherein the voltage sampling circuit is connected with the microprocessor, and configured to sample voltage signals from a photovoltaic combiner box and output the sampled voltage signals to the microprocessor, the microprocessor is further configured to send the voltage signals sampled by the voltage sampling circuit through the communication circuit.

7. The system of claim 1, further comprising a lightning protection monitor circuit, wherein the lightning protection monitor is connected with the microprocessor, and configured to sample lightning protection signals and to output the sampled lightning protection signals to the microprocessor; and the microprocessor is further configured to send the lightning protection signals sampled by the lightning protection monitor circuit through the communication circuit.

8. The system of claim 1, further comprising a digital display circuit, wherein the digital display circuit is connected with the microprocessor, and configured to display the sampled current signals received by the microprocessor.

9. The system of claim 1, further comprising an auxiliary power supply, wherein the auxiliary power supply is connected with the microprocessor, and configured to supply an operation voltage to the microprocessor.

10. The system of claim 1, wherein the communication circuit comprises a lightning protection circuit.

11. The system of claim 2, further comprising a voltage sampling circuit, wherein the voltage sampling circuit is connected with the microprocessor, and configured to sample voltage signals from the photovoltaic combiner box and output the sampled voltage signals to the microprocessor, the microprocessor is further configured to send the voltage signals sampled by the voltage sampling circuit through the communication circuit.

12. The system of claim 2, further comprising a lightning protection monitor circuit, wherein the lightning protection monitor is connected with the microprocessor, and configured to sample lightning protection signals and input the sampled lightning protection signal to the microprocessor; and the microprocessor is further configured to send the lightning protection signals sampled by the lightning protection monitor circuit through the communication circuit.

13. The system of claim 2, further comprising a digital display circuit, wherein the digital display circuit is connected with the microprocessor, and configured to display the sampled signals received by the microprocessor.

14. The system of claim 2, further comprising an auxiliary power supply, wherein the auxiliary power supply is connected with the microprocessor, and configured to supply an operation voltage to the microprocessor.

* * * * *